(12) United States Patent
Choi et al.

(10) Patent No.: US 9,123,740 B2
(45) Date of Patent: Sep. 1, 2015

(54) HIGH ELECTRON MOBILITY TRANSISTORS AND METHODS OF MANUFACTURING THE SAME

(75) Inventors: Hyuk-soon Choi, Hwaseong-si (KR); Jong-seob Kim, Hwaseong-si (KR); Jai-kwang Shin, Anyang-si (KR); Chang-yong Um, Seoul (KR); Jae-joon Oh, Seongnam-si (KR); Jong-bong Ha, Daegu (KR); Ki-ha Hong, Cheonan-si (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/613,677

(22) Filed: Sep. 13, 2012

(65) Prior Publication Data

US 2013/0175539 A1  Jul. 11, 2013

(30) Foreign Application Priority Data

Jan. 11, 2012 (KR) ........................ 10-2012-0003446

(51) Int. Cl.
*H01L 29/15* (2006.01)
*H01L 29/66* (2006.01)
(Continued)

(52) U.S. Cl.
CPC ...... *H01L 29/66462* (2013.01); *H01L 29/7787* (2013.01); *H01L 29/1029* (2013.01); *H01L 29/2003* (2013.01); *H01L 29/207* (2013.01); *H01L 29/36* (2013.01); *H01L 29/7785* (2013.01)

(58) Field of Classification Search
CPC .............. H01L 29/36; H01L 29/66462; H01L 29/7787; H01L 29/1075; H01L 29/2003; H01L 29/1029; H01L 29/207; H01L 29/7785; H01L 21/02389; H01L 21/02458; H01L 29/0254; H01L 23/3738
USPC .................................... 257/76, 190, 192, 194
See application file for complete search history.

(56) References Cited

U.S. PATENT DOCUMENTS 7,612,390 B2 * 11/2009 Saxler et al. ................... 257/194
7,626,217 B2 * 12/2009 Saxler ............................ 257/194
(Continued)

FOREIGN PATENT DOCUMENTS

JP   2010-225938 A   10/2010
JP   2010-251505 A   11/2010
KR   20110074163 A    6/2011

OTHER PUBLICATIONS

Freitas Jr. et al., Properties of Fe-doped semi-insulating GaN substrates for high-frequency device fabrication, 2007, Journal of Crystal Growth 305, 403-407.*

(Continued)

*Primary Examiner* — Brett Feeney
*Assistant Examiner* — Sophia Nguyen
(74) *Attorney, Agent, or Firm* — Harness, Dickey & Pierce, P.L.C.

(57) ABSTRACT

According to example embodiments, a high electron mobility transistor (HEMT) includes a channel supply layer and a channel layer. The channel layer may include an effective channel region and a high resistivity region. The effective channel region may be between the high resistivity region and the channel supply layer. The high resistivity region may be a region into which impurities are ion-implanted. According to example embodiments, a method of forming a HEMT includes forming a device unit, including a channel layer and a channel supply layer, on a first substrate; adhering a second substrate to the device unit; removing the first substrate; and forming a high resistivity region by ion-implanting impurities into at least a portion of the channel layer.

10 Claims, 18 Drawing Sheets

(51) Int. Cl.
  *H01L 29/10* (2006.01)
  *H01L 29/207* (2006.01)
  *H01L 29/20* (2006.01)
  *H01L 29/778* (2006.01)
  *H01L 29/36* (2006.01)

(56) References Cited

U.S. PATENT DOCUMENTS

| | | | |
|---|---|---|---|
| 7,759,701 | B2 | 7/2010 | Das et al. |
| 8,754,449 | B2* | 6/2014 | Dwilinski et al. ............ 257/194 |
| 2002/0079508 | A1 | 6/2002 | Yoshida |
| 2007/0235775 | A1* | 10/2007 | Wu et al. ........................ 257/288 |
| 2008/0087915 | A1* | 4/2008 | Uemoto et al. ............... 257/192 |
| 2008/0124851 | A1* | 5/2008 | Zhang et al. .................. 438/172 |
| 2008/0230786 | A1* | 9/2008 | Heikman et al. ................ 257/76 |
| 2009/0075455 | A1* | 3/2009 | Mishra ........................... 438/458 |
| 2009/0189188 | A1* | 7/2009 | Matsushita .................... 257/192 |
| 2009/0189190 | A1* | 7/2009 | Hashimoto et al. ........... 257/194 |
| 2010/0109051 | A1* | 5/2010 | Wu et al. ....................... 257/194 |
| 2010/0117118 | A1* | 5/2010 | Dabiran et al. ............... 257/190 |
| 2010/0148153 | A1* | 6/2010 | Hudait et al. ................... 257/24 |
| 2010/0187569 | A1* | 7/2010 | Renaud .......................... 257/190 |
| 2010/0258841 | A1* | 10/2010 | Lidow et al. .................. 257/192 |
| 2011/0018003 | A1* | 1/2011 | Okahisa et al. ................. 257/76 |
| 2011/0140172 | A1* | 6/2011 | Chu et al. ...................... 257/194 |
| 2011/0220966 | A1* | 9/2011 | Wu et al. ....................... 257/194 |
| 2012/0097918 | A1* | 4/2012 | Yu et al. ......................... 257/13 |
| 2012/0193677 | A1* | 8/2012 | Parikh et al. .................. 257/190 |
| 2013/0099284 | A1* | 4/2013 | Tserng et al. ................. 257/194 |
| 2013/0240951 | A1* | 9/2013 | Bedell et al. .................. 257/194 |
| 2014/0209975 | A1* | 7/2014 | Kamada ........................ 257/190 |

OTHER PUBLICATIONS

Nomoto et al., Remarkable Reduction of On-Resistance by Ion Implantation in GaN/AlGaN/GaN HEMTs With Low Gate Leakage Current, 2007, IEEE Electron Device Letters, vol. 28, No. 11, 939-941.*

Oishi et al., Highly resistive GaN layers formed by ion implantation of Zn along the c axis, 2003, J. Appl. Phys., vol. 94, No. 3, 1662-1666.*

Kudo et al., High ResistivityGaN Formed by Ion Implantation, 2001, Mat. Res. Soc. Symp. vol. 639, G11.30.1-G11.30.6.*

S. Kato, et al.; "C-doped GaN buffer layers with high breakdown voltages for highpower operation AlGaN/GaN HFETs on 4-in Si substrates by MOVPE"; J. of Crystal Growth 298 (2007) 831-834.

* cited by examiner

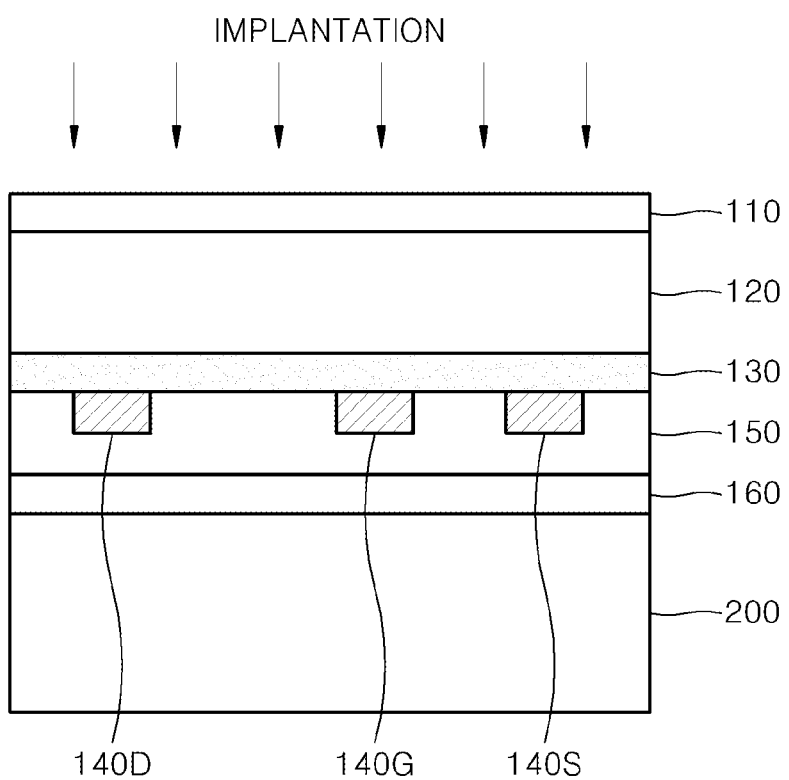

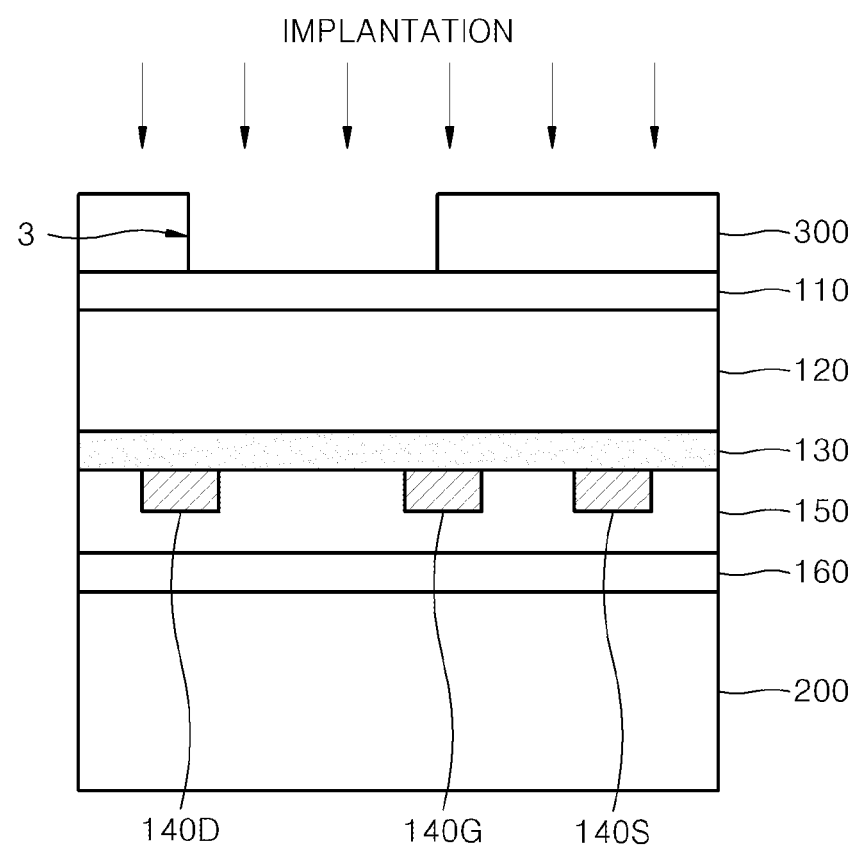

HIGH ELECTRON MOBILITY TRANSISTORS AND METHODS OF MANUFACTURING THE SAME

CROSS-REFERENCE TO RELATED APPLICATIONS

This application claims priority under 35 U.S.C. §119 to Korean Patent Application No. 10-2012-0003446, filed on Jan. 11, 2012, in the Korean Intellectual Property Office, the disclosure of which is incorporated herein in its entirety by reference.

BACKGROUND

1. Field

Example embodiments relate to semiconductor devices and methods of manufacturing the same, and more particularly, to high electron mobility transistors and methods of manufacturing the same.

2. Description of the Related Art

A high electron mobility transistor (HEMT) includes semiconductors having different electric polarization properties. In the HEMT, a semiconductor layer having a relatively high polarizability may induce a two-dimensional electron gas (2DEG) in another semiconductor layer combined thereto. Electron mobility in the 2DEG may be very high. Thus, the 2DEG may be used as a channel.

In order to efficiently use the HEMT in various electronic devices, it may be desirable adjust the characteristics of the HEMT. For example, when using a HEMT as a power device, improving the withstand voltage characteristics of the HEMT may be desirable.

SUMMARY

Example embodiments relate to high electron mobility transistors (HEMTs) having improved withstand voltage characteristics.

Example embodiments relate to methods of manufacturing a HEMT having high withstand voltage characteristics.

Additional aspects will be set forth in part in the description which follows and, in part, will be apparent from the description, or may be learned by practice of example embodiments.

According to example embodiments, a high electron mobility transistor (HEMT) includes: an insulation layer on a substrate; a gate electrode, a source electrode, and a drain electrode, on the insulation layer; a channel supply layer on the insulation layer, the channel supply layer contacting the gate electrode, the source electrode, and the drain electrode; and a channel layer on the channel supply layer. The channel layer includes a two-dimensional electron gas (2DEG) induced by the channel supply layer, an effective channel region contacting the channel supply layer, and a high resistivity region on the effective channel region. The high resistivity region is a region in which impurities are ion-implanted.

The impurities may include at least one of neon (Ne), argon (Ar), carbon (C), iron (Fe), and vanadium (V).

The impurities may be ion-implanted at a concentration of about $10^{15}/cm^3$ to about $10^{21}/cm^3$ in the high resistivity region The high resistivity region may have a resistivity equal to or greater than about $10^7$ Ω·cm.

The high resistivity region may extend throughout a top portion of the channel layer.

The high resistivity region may extend throughout a part of a top portion of the channel layer.

The part of the top portion of the channel layer that includes the high resistivity region may correspond to a region between the gate electrode and the drain electrode.

A thickness of the effective channel region may be about 50 nm to about 200 nm.

The channel layer may include a gallium nitride (GaN)-based material. For example, the channel layer may include GaN.

The channel supply layer may include one of a single and a multi-layer structure. The channel supply layer includes a nitride that contains at least one of aluminum (Al), gallium (Ga), indium (In), and boron (B). For example, the channel supply layer may include of a single and multi-layer structure that includes at least one of AlGaN, AlInN, AlN, AlInGaN, and the like.

The HEMT may further include a buffer layer on the channel layer.

At least a part of the buffer layer may be a region into which the impurities are ion-implanted.

The HEMT may further include a metal layer between the substrate and the insulation layer.

The substrate may include one of a silicon (Si) substrate, a silicon carbide (SiC) substrate, an aluminum nitride (AlN) substrate, a direct bonded copper (DBC) substrate, and a metal substrate.

A power device may include a HEMT according to example embodiments.

According to example embodiments, a method of manufacturing a high electron mobility transistor (HEMT), includes: forming a channel layer on a first substrate; forming a channel supply layer on the channel layer; forming a gate electrode, a source electrode, and a drain electrode spaced apart from each other on the channel supply layer; forming an insulation layer covering the gate electrode, the source electrode, and the drain electrode on the channel supply layer; adhering a second substrate to the insulation layer; removing the first substrate; and forming a high resistivity region in the channel layer by ion-implanting impurities from a side where the first substrate is removed to a depth of the channel layer that is less than a thickness of the channel layer.

The impurities may include at least one of neon (Ne), argon (Ar), carbon (C), iron (Fe), and vanadium (V).

The forming the high resistivity region by ion-implanting includes implanting the impurities at a concentration of about $10^{15}/cm^3$ to about $10^{21}/cm^3$ in a portion of the channel layer.

A resistivity of the high resistivity region may be equal to or greater than about $10^7$ Ω·cm.

The impurities may be ion-implanted through an entire top surface of the channel layer, and the high resistivity region may extend throughout a top portion of the channel layer.

The impurities may be ion-implanted through a part of a top surface of the channel layer, and the high resistivity region may extend throug a part of a top portion of the channel layer.

The part of the top portion of the channel layer including high resistivity region may correspond to a region between the gate electrode and the drain electrode.

A region of the channel layer below the high resistivity region may have a thickness from about 50 nm to about 200 nm.

The channel layer may include a gallium nitride (GaN)-based material. For example, the channel layer may include GaN.

The channel supply layer may have one of a single and multi-layer structure. The channel supply layer may include a nitride that contains at least one of aluminum (Al), gallium (Ga), indium (In), and boron (B). For example, the channel supply layer may have one of a single and multi-layer structure including at least one of AlGaN, AlInN, AlN, AlInGaN, and the like.

The method may further include forming a buffer layer between the first substrate and the channel layer.

The method may further include forming a bonding layer between the insulation layer and the second substrate.

The bonding layer may be formed of a metal.

According to example embodiments, a high electron mobility transistor (HEMT) includes: an insulation layer; a gate electrode, a source electrode, and a drain electrode on the insulating layer; a channel supply layer on the insulation layer; and a channel layer on the channel supply layer. The channel layer includes a first channel region containing a two-dimensional electron gas (2DEG) induced by at least part of the channel supply layer and a second channel region on the first channel region. An electrical resistivity of the second channel region is greater than an electrical resistivity of the first channel region. A density of crystalline defects in the second channel region is greater than a density of crystalline defects in the first channel region.

The second channel region may be a region in which impurities are ion-implanted.

A width extending in a first direction of the channel supply layer may be greater than or equal to a width extending in the first direction of the second channel region. The gate electrode may be between the source electrode and the drain electrode spaced apart in the first direction.

The HEMT may further include at least one of a substrate and a metal layer supporting the insulation layer. A resistivity of the second channel region may be equal to or greater than about $10^7$ $\Omega \cdot cm$ A width extending in a first direction of the first channel region may be greater than or equal to a width extending in the first direction of the second channel region. The source electrode and the drain electrode may be spaced apart in the first direction.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphases instead being placed upon illustrating the principles of example embodiments. In the drawings:

FIGS. 6A through 6H are cross-sectional views for describing a method of manufacturing a HEMT, according to example embodiments; and FIGS. 7A through 7D are cross-sectional views for describing a method of manufacturing a HEMT, according to example embodiments.

DETAILED DESCRIPTION

Figure 1:
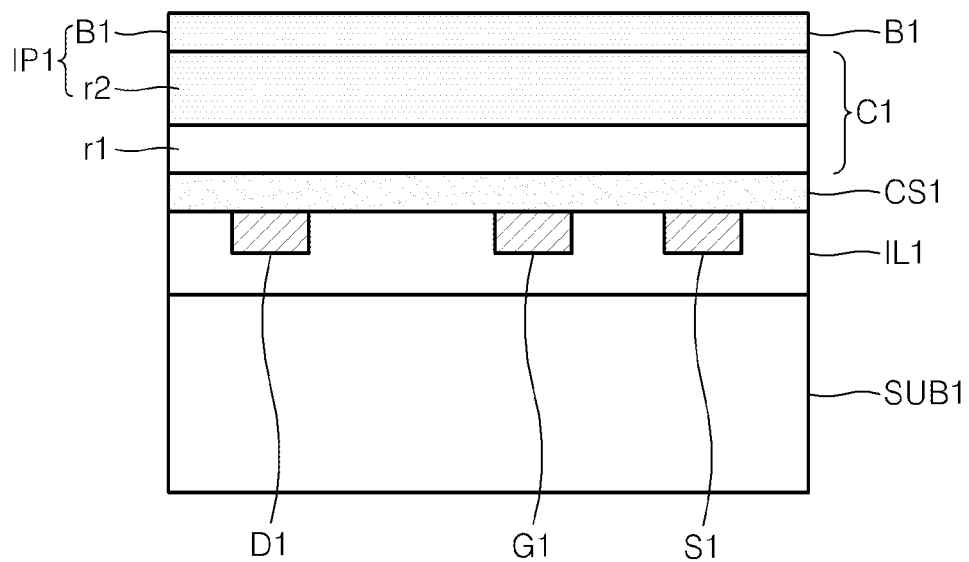
FIG. 1 is a cross-sectional view of a high electron mobility transistor (HEMT) according to example embodiments.

Various example embodiments will now be described more fully with reference to the accompanying drawings in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted into non-implanted region. Likewise, a buried region formed by implantation may result in some implantation into the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, high electron mobility transistors (HEMT) and methods of manufacturing the same, according to example embodiments will be described in detail with reference to accompanying drawings. In drawings, widths and thicknesses of layers or regions may be exaggerated for clarity, and like reference numerals denote like elements.

FIG. 1 is a cross-sectional view of a HEMT according to example embodiments.

Referring to FIG. 1, an insulation layer ID may be disposed on a substrate SUB1. The substrate SUB1 may be any one of a silicon (Si) substrate, a silicon carbide (SiC) substrate, an aluminum nitride (AlN) substrate, a direct bonded copper (DBC) substrate, and a metal substrate. However, a type of the substrate SUB1 is not limited thereto, and may vary. The insulation layer ID may be formed of any insulation material, such as at least one of silicon nitride, silicon oxide, silicon oxynitride, aluminum nitride, and aluminum oxide. Also, the insulation layer ID may be formed of an insulative polymer. A drain electrode D1, a gate electrode G1, and a source electrode S1 may be disposed spaced apart from each other in the insulation layer IL1. The drain electrode D1, gate electrode G1, and source electrode S1 may be metals or metal compounds, but example embodiments are not limited thereto. A plurality of grooves may be formed in a top surface of the insulation layer IL1, and the drain electrode D1, the gate electrode G1, and the source electrode S1 may be formed in the grooves, respectively. The drain and source electrodes D1 and S1 may be disposed on one and another side of the gate electrode G1, respectively. The source electrode S1 may be disposed closer to the gate electrode G1 than the drain electrode D1. In other words, a distance between the source and gate electrodes S1 and G1 may be shorter than a distance between the drain and gate electrodes D1 and G1. However, relative distances between the source, drain, and gate electrodes S1, D1, and G1 may differ.

A channel supply layer CS1 contacting the drain, gate, and source electrodes D1, G1, and S1 may be disposed on the insulation layer IL1. The channel supply layer CS1 may induce a two-dimensional electron gas (2DEG) (not shown) in a channel layer C1 which is formed on the channel supply layer CS1. The channel supply layer CS1 may include a material having higher polarizability and/or larger energy bandgap than the channel layer C1. For example, the channel supply layer CS1 may have a single or multi-layer structure including at least one material selected from among nitrides including at least one of aluminum (Al), gallium (Ga), indium (In), and boron (B). In detail, the channel supply layer CS1 may have a single or multi-layer structure including at least one of various materials consisting of AlGaN, AlInN, AlN, AlInGaN, BN, and so on. A thickness of the channel supply layer CS1 may be equal to or less than about several tens of nm. For example, the thickness of the channel supply layer CS1 may be equal to or less than about 50 nm.

The channel layer C1 may be disposed on the channel supply layer CS1. The channel layer C1 may include a material having smaller polarizability and/or energy bandgap than the channel supply layer CS1. For example, the channel layer C1 may include a GaN-based material, such as GaN. A 2DEG (not shown) induced by the channel supply layer CS1 may exist in the channel layer C1. The 2DEG may be formed in a portion of the channel layer C1 adjacent to the interface between the channel layer C1 and the channel supply layer CS1. The thickness of the channel layer C1 may be thicker than that of the channel supply layer CS1. For example, the thickness of the channel layer C1 may be from about 2 μm to about 3 μm. However, in some cases, the thickness of the channel layer C1 may be greater than about 3 μm.

The channel layer C1 may include a high resistivity region r2 in a top portion (upper portion) thereof. The high resistivity region r2 may be a region into which impurities are ion-implanted. The impurities may include at least one of inert elements, such as neon (Ne) and argon (Ar), typical elements, such as carbon (C), and metal elements, such as iron (Fe) and vanadium (V). As such impurities are ion-implanted, the crystallinity of the top portion of the channel layer C1 may be deteriorated (broken), and as a result, the high resistivity region r2 having a relatively high electrical resistance may be formed. The impurities may be ion-implanted at a concentration of about $10^{15}/cm^3$ to about $10^{21}/cm^3$. The resistivity of the high resistivity region r2 may be equal to or greater than about $10^7$ Ω·cm. For example, the resistivity of the high resistivity region r2 may be from about $10^7$ Ω·cm to about $10^{13}$ Ω·cm. By using the high resistivity region r2, a current leakage or dielectric breakdown through the top portion (upper portion) of the channel layer C1 may be suppressed (and/or prevented). In this regard, a HEMT according to example embodiments may have an excellent withstand voltage characteristic.

In the channel layer C1, a region below the high resistivity region r2 may be an effective channel region r1. The effective channel region r1 is a region where the impurities are not ion-implanted and may have excellent crystallinity. The 2DEG described above may be formed in the effective channel region r1. The thickness of the effective channel region r1 may be from about 50 nm to about 200 nm, for example.

A buffer layer B1 may be further disposed on the channel layer C1. The buffer layer B1 may include a transition layer. For example, the buffer layer B1 may have a single or multi-layer structure including at least one material selected from among nitrides including at least one of Al, Ga, In, and B. In detail, the buffer layer B1 may have a single or multi-layer structure including at least one of various materials consisting of AlN, GaN, AlGaN, AlInN, AlGaInN, BN, and so on. The buffer layer B1 may be a region into which the impurities are ion-implanted, like the high resistivity region r2. Accordingly, the buffer layer B1 and the high resistivity region r2 may be together referred to as an ion-implanted region IP1.

The structure of the HEMT of FIG. 1 may be modified in various ways. For example, a metal layer (bonding layer) may be further disposed between the substrate SUB1 and the insulation layer IL1, as shown in FIG. 2.

Figure 2:
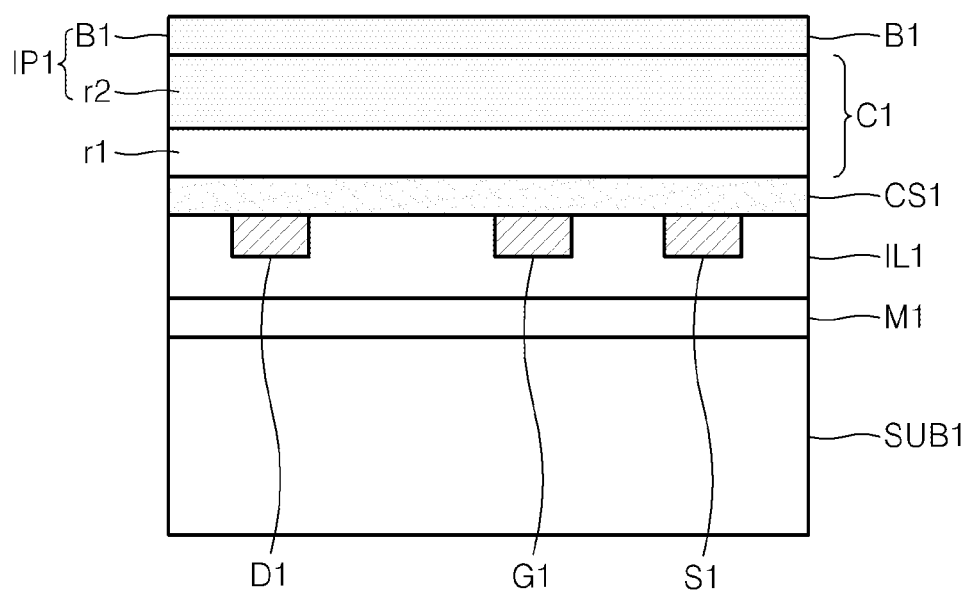
FIG. 2 is a cross-sectional view of a HEMT according to example embodiments.

Referring to FIG. 2, a metal bonding layer M1 may be disposed between the substrate SUB1 and the insulation layer IL1. The metal bonding layer M1 may improve adhesive strength between the substrate SUB1 and the insulation layer IL1. The metal bonding layer M1 may have a single or multi-layer structure including at least one of copper (Cu), gold (Au), tin (Sn), and an alloy thereof. The forming of the metal bonding layer M1 may be determined according to materials of the substrate SUB1 and insulation layer IL1.

In the structures of FIGS. 1 and 2, a range, a location, a size, etc. of the high resistivity region r2 may vary.

Figure 3:
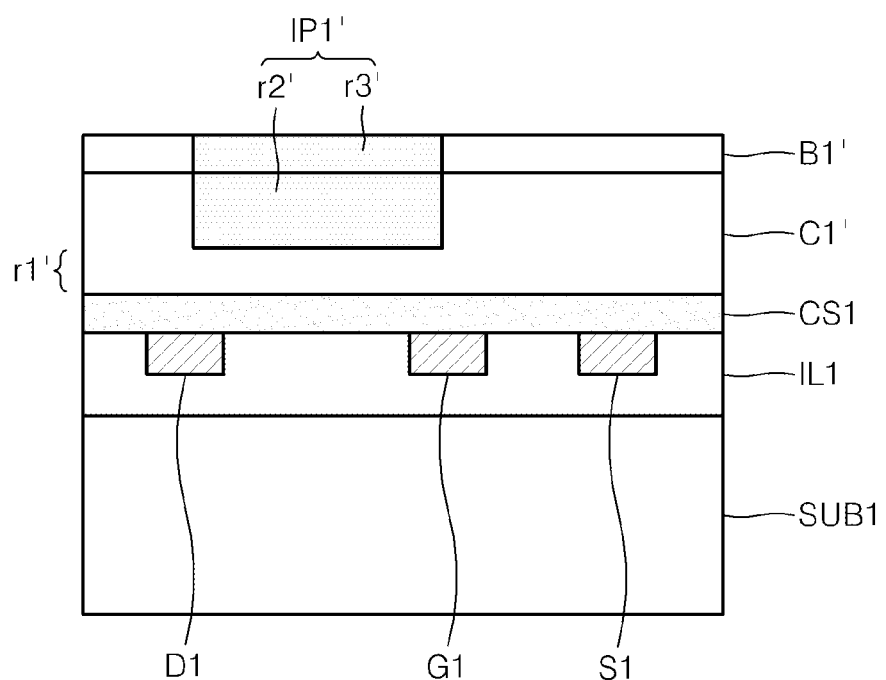
FIG. 3 is a cross-sectional view of a HEMT according to example embodiments.

FIG. 3 is a cross-sectional view of a HEMT according to example embodiments.

Referring to FIG. 3, a part of a top portion (upper portion) of a channel layer C1' may include a high resistivity region r2'. In FIGS. 1 and 2, the high resistivity region r2 is formed along an entire top portion of the channel layer C1. In FIG. 3, the high resistivity region r2' may be selectively formed along a part of the top portion of the channel layer C1'. The high resistivity region r2' may correspond to a region between the gate and drain electrodes G1 and D1. Since a portion of the channel layer C1' corresponding to the region between the gate and drain electrodes G1 and D1 is a region to which a relatively high voltage is applied, such a portion may significantly affect withstanding voltage characteristics of the HEMT. Accordingly, by selectively forming the high resistivity region r2' in the top portion of the channel layer C1' between the gate and drain electrodes G1 and D1, a HEMT having improved withstanding voltage characteristics may be obtained. An effective channel region r1' disposed below the high resistivity region r2' may extend to both sides of the high resistivity region r2'. The effective channel region r1' may substantially be the same as or similar to the effective channel region r1 of FIG. 1. A buffer layer B1' may have an ion-implanted buffer region r3' above the high resistivity region r2'. The high resistivity region r2' and the ion-implanted buffer region r3' may be together referred to as an ion-implanted region IP1'.

Figure 4:
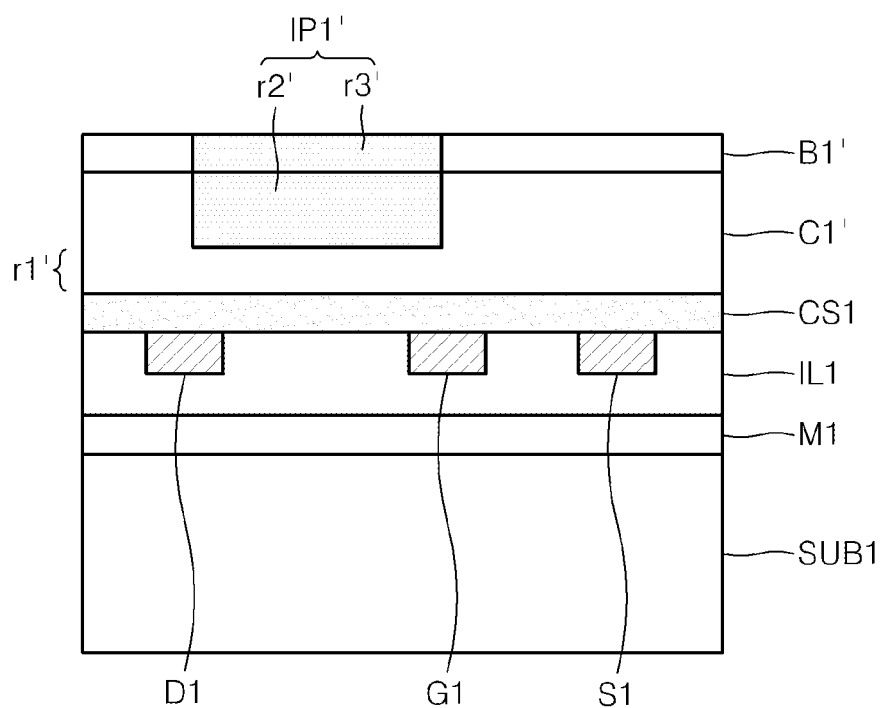
FIG. 4 is a cross-sectional view of a HEMT according to example embodiments.

FIG. 4 is a cross-sectional view of a HEMT according to example embodiments, wherein a metal bonding layer M1 is further disposed between the substrate SUB1 and the insulation layer ID of FIG. 3. The metal bonding layer M1 of FIG. 4 may be identical to the metal bonding layer M1 of FIG. 2.

The high resistivity regions r2 and r2' described with reference to FIGS. 1 through 4 are formed by ion-implanting impurities and may have different crystallinity and properties than a general resistive GaN layer. The general resistive GaN layer is formed by adding desired (and/or alternatively predetermined) amounts of impurities while growing a GaN layer. While forming the general resistive GaN layer, the impurities are added while maintaining an intrinsic crystalline structure of the GaN layer instead of breaking the intrinsic crystalline structure. However, since the high resistivity regions r2 and r2' are formed by ion-implanting the impurities into an already formed channel layer (for example, a GaN layer), the crystalline structure is broken by the ion-implantation. As a result, the resistance increases where the crystalline structure is broken and a high resistance may be obtained.

Also, by controlling a range and depth of an ion-implanted region, a size, a location, a depth, etc. of the high resistivity regions r2 and r2' may be easily controlled. The high resistivity regions r2 and r2' may have a higher density of crystalline defects than the effective channel region r1.

Although not shown in FIGS. 1 through 4, a gate insulation layer or a depletion layer may be further disposed between the gate electrode G1 and the channel supply layer CS1. The gate insulation layer may include, for example, at least one of Al2O3, SiOx, SixNy, Sc2O3, AlN, Ga2O3, Gd2O3, AlxGa2(1-x)O3, MgO, and a combination thereof. Even though it is not described, any material used for a gate insulation layer of a general transistor may be used in the gate insulation layer. The depletion layer may be a p-type semiconductor layer or dielectric layer, or a layer doped with p-type impurities, e.g., a p-doped layer. In detail, the depletion layer may be formed of any one of GaN, InN, AlGaN, AlInN, InGaN, and AlInGaN, and may be doped with p-type impurities, such as magnesium (Mg). Also, in some cases, a portion of the channel supply layer CS1 corresponding to the gate electrode G1 or portions of the channel supply layer CS1 and channel layer C1 or C1' corresponding to the gate electrode G1 may be etched (recessed), and the gate electrode G1 may be formed in the etched region (recessed region). The structures of the HEMTs in FIGS. 1 through 4 may be modified in other ways.

For example, while FIGS. 1 through 4 illustrate the source electrode S1, gate electrode G1, and drain electrode D1 are about the same width and thickness, the respective dimensions of the electrodes may vary. The gate electrode G1 may have a width or thickness that is greater than a width or thickness of at least one of the source electrode S1 and drain electrode D1. Alternatively, the gate electrode G1 may have a width or thickness that is less than a width or thickness of at least one of the source electrode S1 and drain electrode D1.

Figure 5:
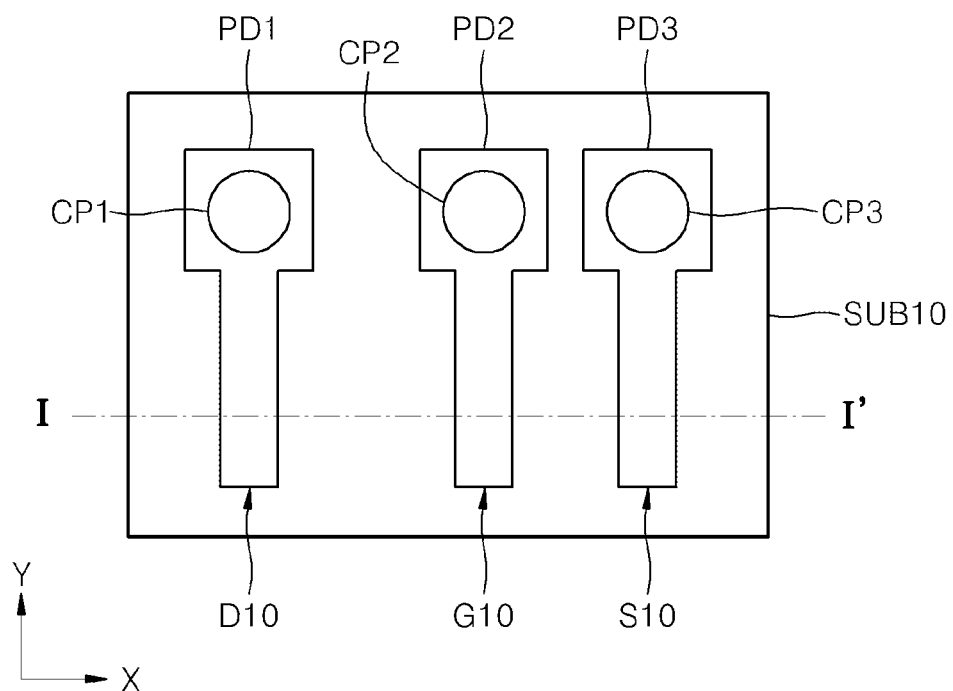
FIG. 5 is a plan view of main elements of a HEMT, according to example embodiments.

FIG. 5 is a plan view of main elements of a HEMT, according to example embodiments. A substrate SUB10, a drain electrode D10, a gate electrode G10, and a source electrode S10 of FIG. 5 may respectively correspond to the substrate SUB1, the drain electrode D1, the gate electrode G1, and the source electrode S1 of FIG. 1.

Referring to FIG. 5, the drain electrode D10, the gate electrode G10, and the source electrode S10 may extend in a desired (and/or alternatively predetermined) direction, for example, in a Y-axis direction. The drain, gate, and source electrodes D10, G10, and S10 may respectively include first through third pad portions PD1 through PD3 at ends thereof. The first through third pad portions PD1 through PD3 may have relatively large widths than the remaining portions. First through third contact plugs CP1 through CP3 may be respectively connected to the first through third pad portions PD1 through PD3. Although not shown in FIG. 5, first through third wires may be further connected respectively to the first through third contact plugs CP1 through CP3. A desired (and/or alternatively predetermined) electrical signal may be input to or output from the drain, gate, and source electrodes D10, G10, and S10 through the first through third wires (not shown) and first through third contact plugs CP1 through CP3. A cross-sectional view taken along a line I-I' of FIG. 5 may be the cross-sectional view shown in FIG. 1. The plane structure shown in FIG. 5 is only an example and may vary.

FIGS. 6A through 6H are cross-sectional views for describing a method of manufacturing a HEMT, according to example embodiments.

Figure 6A:
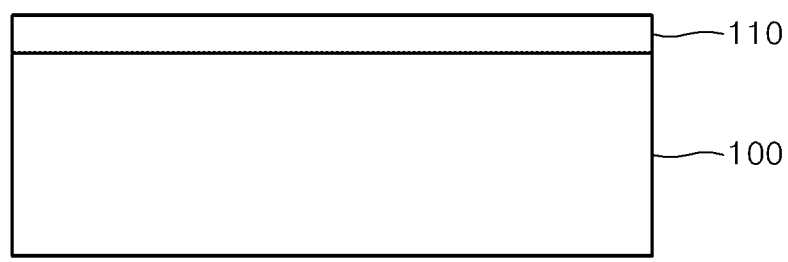

Referring to FIG. 6A, a buffer layer 110 may be formed on a first substrate 100. The first substrate 100 may be a Si substrate or another substrate, such as a sapphire substrate, a SiC substrate or the like. The buffer layer 110 may include a transition layer. The buffer layer 110 may be used to reduce differences of lattice constant and thermal expansion coefficient between the first substrate 100 and a channel layer (120 of FIG. 6B) which will be formed on the first substrate 100, thereby reducing (and/or preventing) deterioration of crystallinity of the channel layer (120 of FIG. 6B). The buffer layer 110 may have a single or multi-layer structure including at least one material selected from among nitrides including at least one of Al, Ga, In, and B. In detail, the buffer layer 110 may have a single or multi-layer structure including at least one of various materials, such as AlN, GaN, AlGaN, AlInN, AlGaInN, and so on. In some cases, a seed layer (not shown) may be further formed between the first substrate 100 and the buffer layer 110.

Figure 6B:
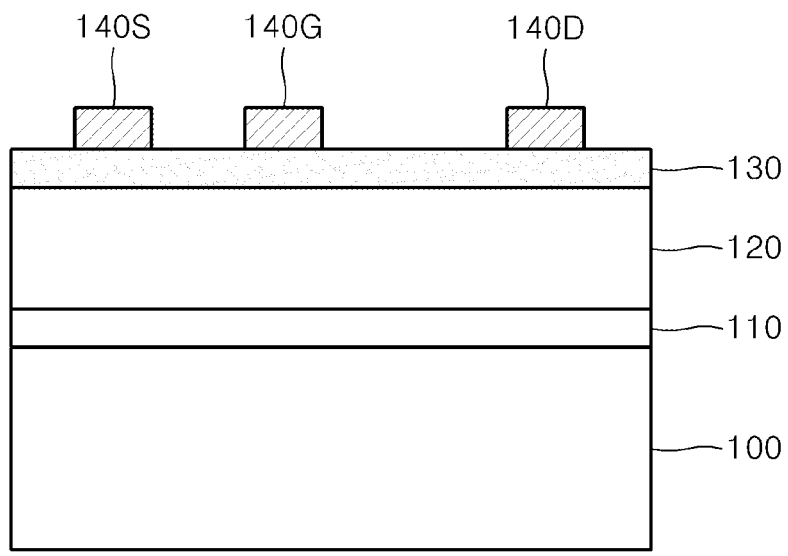

Referring to FIG. 6B, the channel layer 120 may be formed on the buffer layer 110. The channel layer 120 may be formed of a compound semiconductor, such as GaN. In this case, the channel layer 120 may be an undoped GaN layer. As such, when the channel layer 120 is formed as an undoped GaN layer, the channel layer 120 may have excellent crystallinity. Specifically, a top portion (upper portion) of the channel layer 120, which will be used as an effective channel region later, may have excellent crystallinity. While FIG. 6B is described for a case where the channel layer 120 is formed of GaN, example embodiments are not limited thereto and a material of the channel layer 120 may vary. The thickness of the channel layer 120 may be from about 2 μm to about 3 μm. However, in some cases, the thickness of the channel layer 120 may be greater than about 3 μm.

Next, a channel supply layer 130 may be formed on the channel layer 120. The channel supply layer 130 may include a material having different polarization characteristics from the channel layer 120. For example, the channel supply layer 130 may include a material having higher polarizability and/or larger energy bandgap than the channel layer 120. A 2DEG (not shown) may be formed in the channel layer 120 by the channel supply layer 130. The channel supply layer 130 may have a single or multi-layer structure including at least one material selected from among nitrides including at least one of Al, Ga, In, and B. In detail, the channel supply layer 130 may have a single or multi-layer structure including at least one of various materials, such as AlGaN, AlInN, AlN, AlInGaN, and so on. The channel supply layer 130 may have a thickness equal to or less than several tens of nm, for example, equal to or less than about 50 nm.

A gate electrode 140G, a source electrode 140S, and a drain electrode 140D, which are spaced apart from each other, may be formed on the channel supply layer 130. The source and drain electrodes 140S and 140D may be disposed at one and another sides of the gate electrode 140G, respectively. The source electrode 140S may be disposed closer to the gate electrode 140G than the drain electrode 140D. In other words, a distance between the source and gate electrodes 140S and 140G may be shorter than a distance between the drain and gate electrodes 140D and 140G. However, relative distances between the source, drain, and gate electrodes 140S, 140D, and 140G may vary. Although not shown, a gate insulation layer or a depletion layer may be further formed between the gate electrode 140G and the channel supply layer 130, if required. The gate insulation layer may include at least one of Al2O3, SiOx, SixNy, Sc2O3, AlN, Ga2O3, Gd2O3, AlxGa2 (1-x)O3, MgO, and a combination thereof. Even though not described herein, any material for a gate insulation layer of a general transistor may be used as a material of the gate insulation layer. The depletion layer may be a p-type semiconductor layer or a dielectric layer, or may be a layer doped with p-type impurities, e.g., p-doped layer. In detail, the depletion layer may be formed of one of GaN, InN, AlGaN, AlInN, InGaN, and AlInGaN, and may be doped with p-type impurities, such as Mg. Also, in some cases, a portion of the channel supply layer 130 or portions of the channel supply layer 130 and channel layer 120 may be recessed, and the gate electrode 140G may be formed in the recessed region.

Figure 6C:
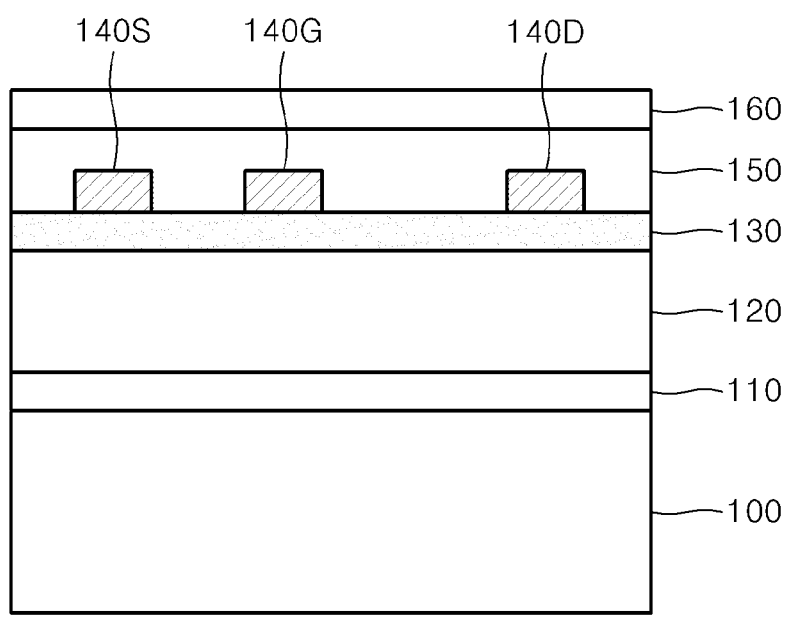

Referring to FIG. 6C, an insulation layer 150 covering the gate, source, and drain electrodes 140G, 140S, and 140D may be formed on the channel supply layer 130. The insulation layer 150 may be formed of any insulation material, such as silicon nitride, silicon oxide, silicon oxynitride, aluminum nitride, aluminum oxide or the like, but example embodiments are not limited thereto. The insulation layer 150 may be formed of an insulative polymer. Then, a bonding layer 160 may be formed on the insulation layer 150. The bonding layer 160 may have a single or multi-layer structure including at least one of Cu, Au, Sn, and an alloy thereof. In some cases, the bonding layer 160 may not be formed.

Figure 6D:
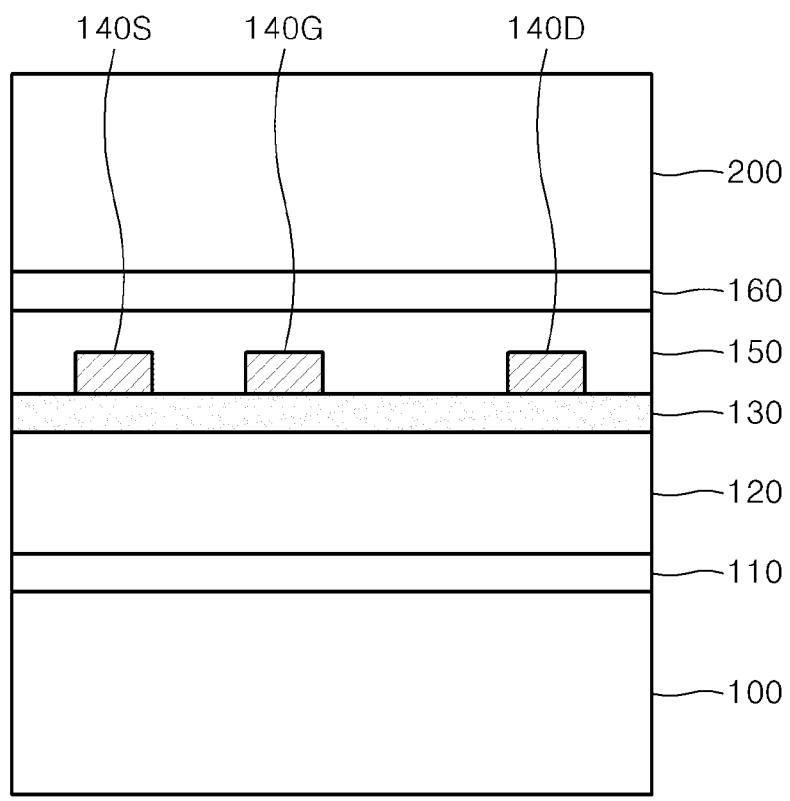

Referring to FIG. 6D, a second substrate 200 may be adhered on the bonding layer 160. The second substrate 200 may be a Si substrate, a SiC substrate, an AlN substrate, a DBC substrate, or a metal substrate. However, a type of the second substrate 200 is not limited thereto and may vary. In some cases, a second bonding layer (not shown) may be formed on a bottom surface of the second substrate 200, and the second substrate 200 may be adhered to the bonding layer 160 or the insulation layer 150 by adhering the second bonding layer to the bonding layer 160 or the insulation layer 150.

Figure 6E:
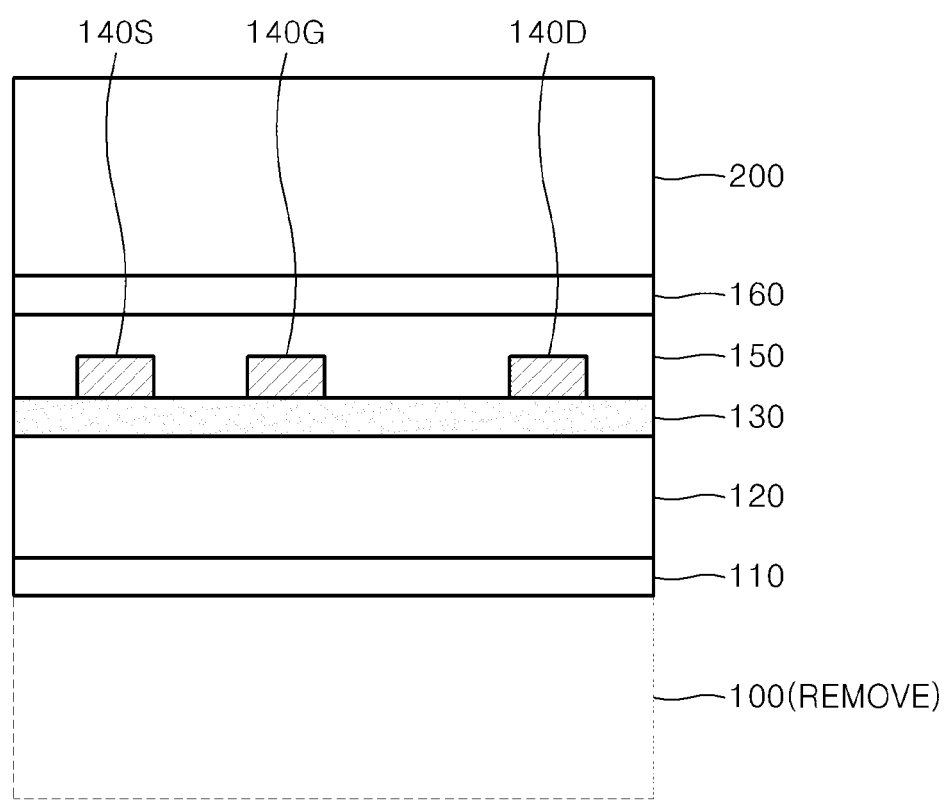

Referring to FIG. 6E, the first substrate 100 may be removed. The first substrate 100 may be removed by various ways. For example, a lower portion of the first substrate 100 may be removed via a polishing process, and then the remaining portion of the first substrate 100 may be removed via an etching process. The etching process for removing the remaining portion of the first substrate 100 may be a dry etching process. If the first substrate 100 is a Si substrate, the first substrate 100 may be etched by using an etch gas including SF6. However, a process of removing the remaining portion of the first substrate 100 is not limited to the dry etching process. In some cases, the remaining portion of the first substrate 100 may be removed via a wet etching process. A removing method of the first substrate 100 described herein is only an example, and thus, may vary.

Figure 6F:
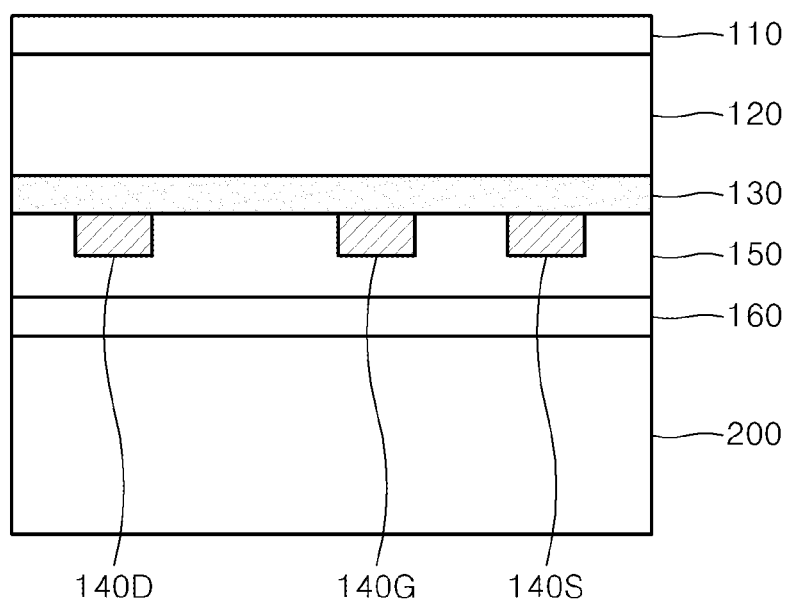

When the structure shown in FIG. 6E from which the first substrate 100 is removed is turned over, a structure shown in FIG. 6F may be obtained. In FIG. 6F, the bonding layer 160 and the insulation layer 150 are disposed on the second substrate 200, the drain, gate, and source electrodes 140D, 140G, and 140S are disposed on the insulation layer 150, and the channel supply layer 130, the channel layer 120, and the buffer layer 110 are sequentially disposed thereon.

Referring to FIG. 6G, impurities may be ion-implanted into the channel layer 120 from above the buffer layer 110. The impurities may include at least one inert element, such as Ne and Ar, typical elements, such as C, and metal elements, such as Fe and V. Here, an ion-implantation dose of the impurities may be from about $10^{12}$/cm2 to about $10^{16}$/cm2, and ion-implantation energy may be from about 30 KeV to about 100 KeV. As a result of the ion-implantation of FIG. 6G, the structure of FIG. 6H may be obtained.

Figure 6H:
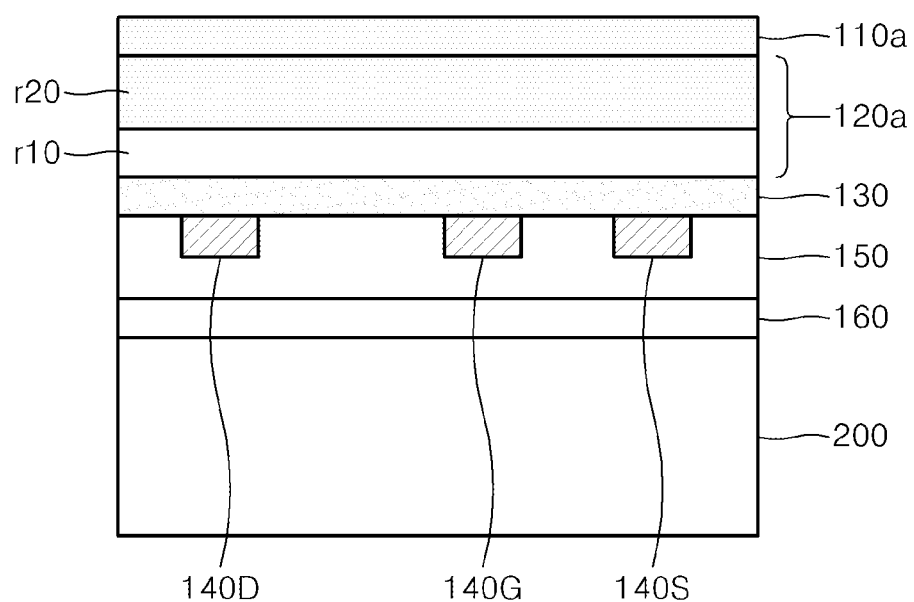

Referring to FIG. 6H, a high resistivity region r20 may be formed in a top portion (upper portion) of the channel layer 120a. The high resistivity region r20 is a region into which the impurities are ion-implanted. As the impurities are ion-implanted, the crystallinity of the top portion of the channel layer 120a may be deteriorated (broken), and thus, the high resistivity region r20 having a relatively high electrical resistance may be formed. The impurities may be ion-implanted at a concentration of from about $10^{15}/cm^3$ to about $10^{21}/cm^3$. The resistivity of the high resistivity region r20 may be equal to or greater than about $10^7$ Ω·cm. For example, the resistivity of the high resistivity region r20 may be from about 107 Ω·cm to about 1013 Ω·cm. A region of the channel layer 120a below the high resistivity region r20 into which the impurities are not ion-implanted is an effective channel region r10. The thickness of the effective channel region r10 may be from about 50 nm to about 200 nm. In addition, the impurities may also be ion-implanted into the buffer layer 110 of FIG. 6G, and thus an ion-implanted buffer layer 110a may be formed.

The method described above may be modified in various ways. For example, the buffer layer 110 in FIG. 6F may be removed, and then the ion-implanting process of FIG. 6G may be performed on the channel layer 120. Alternatively, the impurities may be ion-implanted with the buffer layer 110 not removed, and the ion-implanted buffer layer 110a may be removed in FIG. 6H. Other variations are possible.

According to example embodiments, a high withstand voltage HEMT having the high resistivity region r20 may be easily manufactured by removing the first substrate 100 and backside ion-implantation. According to a general method of manufacturing a HEMT, a HEMT is manufactured by forming a resistive GaN layer, sequentially stacking a GaN layer (a single-crystal layer) and an AlGaN layer (a single-crystal layer) on the resistive GaN layer, and forming gate, source, and drain electrodes on the AlGaN layer. Here, the resistive GaN layer is formed by adding desired (or alternatively predetermined) impurities while growing a GaN layer. Since the GaN layer (a single-crystal layer) and the AlGaN layer (a single-crystal layer) should be formed on the resistive GaN layer, it is required that the resistive GaN layer is grown to have excellent crystallinity. However, it is not easy to form the resistive GaN layer having excellent crystallinity. Accordingly, it may be difficult to form a GaN layer having excellent crystallinity on the resistive GaN layer, and as a result, it may be difficult to obtain a high performance of a HEMT. In order to improve crystallinity, the resistive GaN layer may be formed to have a very large thickness, but which may be result in increasing manufacturing costs and a size of the device.

However, according to example embodiments, a channel layer (for example, an undoped GaN layer) is formed first, and then a high resistivity region (for example, a high resistance GaN layer) is formed by ion-implanting impurities to a desired (and/or alternatively predetermined) depth from a rear surface (backside) of the channel layer. Since the channel layer formed first is an undoped layer, the channel layer may be grown to have excellent crystallinity. Thus, a portion used as an effective channel region in the channel layer (a region into which impurities are not ion-implanted, e.g., the effective channel region r1 of FIG. 1) may have excellent crystallinity. Meanwhile, since the high resistivity region (for example, a high resistance GaN layer) is formed by breaking crystallinity thereof via ion-implantation, the high resistivity region may have high electrical resistance. Accordingly, a HEMT having excellent performance may be manufactured.

FIGS. 7A through 7D are cross-sectional views for describing a method of manufacturing a HEMT, according to example embodiments.

Figure 7A:
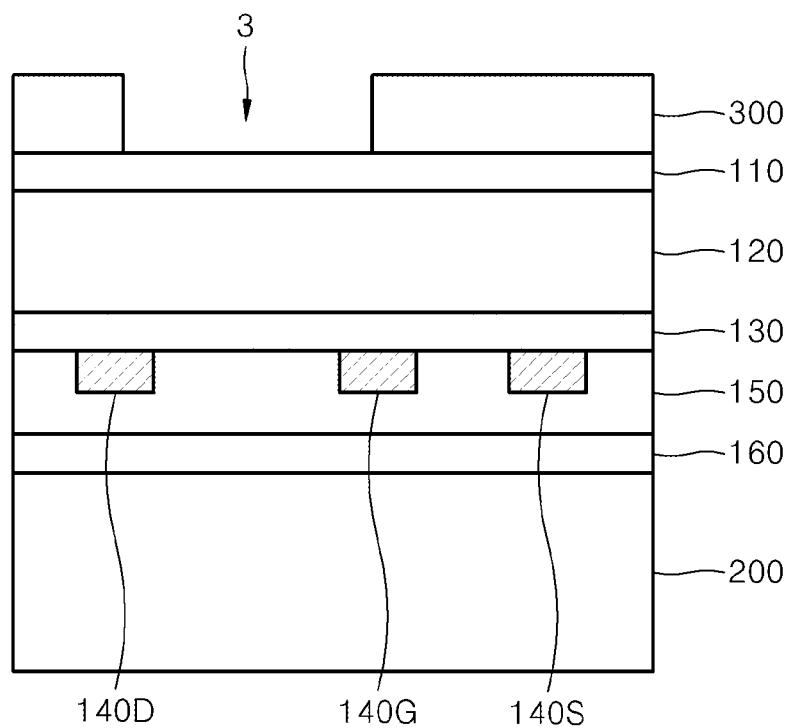

Referring to FIG. 7A, after preparing the structure shown in FIG. 6F, a mask pattern 300 may be formed on the buffer layer 110. The mask pattern 300 may be formed of, for example, a photosensitive material, but example embodiments are not limited thereto. The mask pattern 300 may have a desired (and/or alternatively predetermined) opening 3. A region of ion-implantation may be defined by the opening 3.

A location and width of the opening 3 may correspond to a region between the drain and gate electrodes 140D and 140G.

Referring to FIG. 7B, impurities may be ion-implanted into the channel layer 120 by using the mask pattern 300 as an ion-implantation mask (e.g., ion-implantation barrier). The impurities may be implanted into the buffer layer 110 exposed by the opening 3 and the channel layer 120 below the buffer layer 110. A type of the impurities and conditions of ion-implantation may be the same as those described above with reference to FIG. 6G. The structure of FIG. 7C may be obtained as a result of the ion-implantation of FIG. 7B.

Figure 7C:
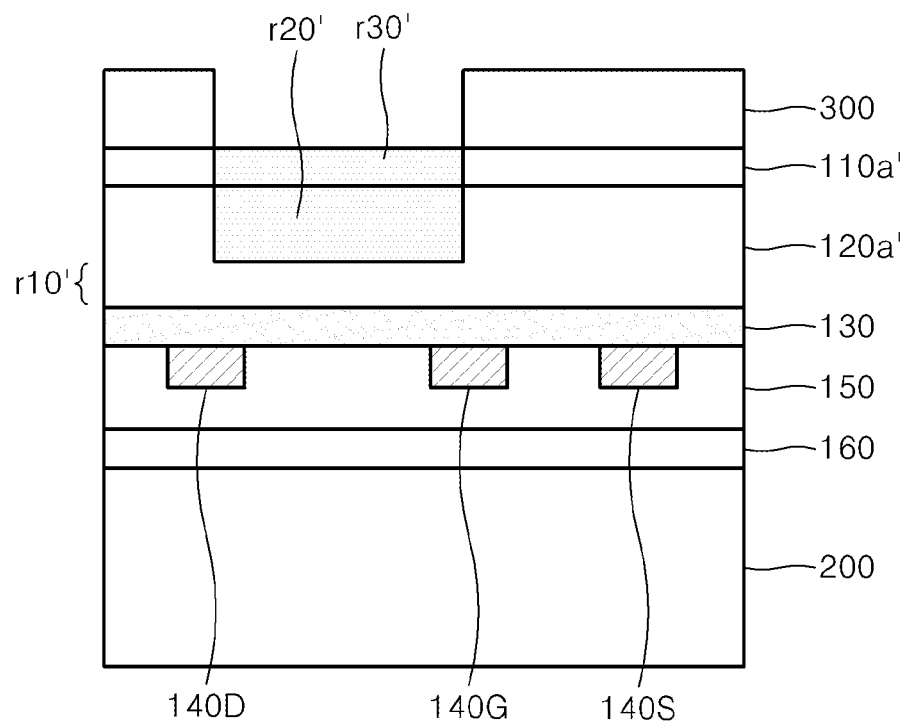
Figure 7D:
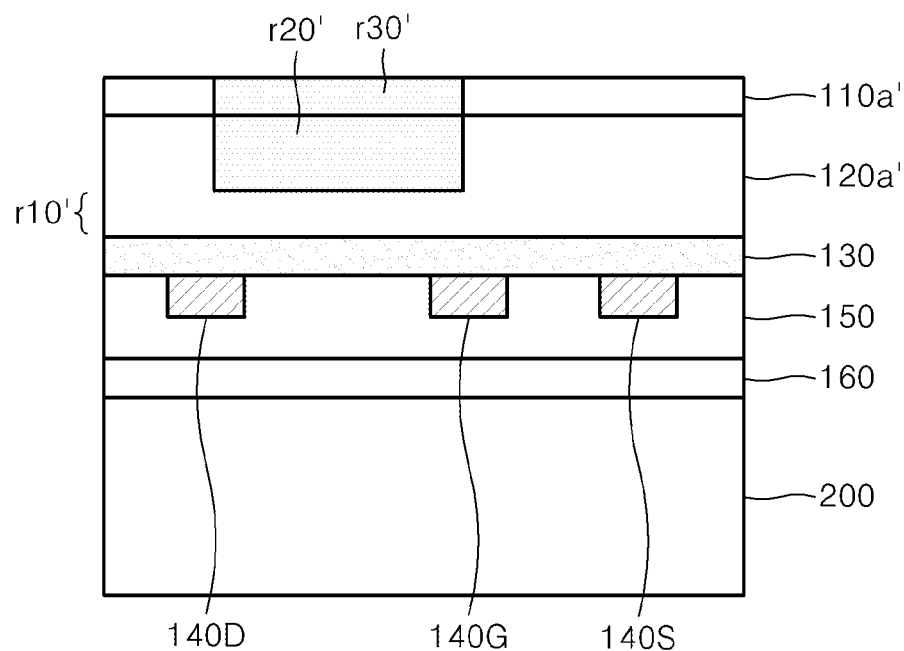

Referring to FIG. 7C, a high resistivity region r20' may be formed in a part of a top portion (upper portion) of the channel layer 120a'. The high resistivity region r20' may correspond to a region between the drain and gate electrodes 140D and 140G. The high resistivity region r20' is a region into which the impurities are ion-implanted. The impurities may be ion-implanted at a concentration of about $10^{15}/cm^3$ to about $10^{21}/cm^3$. The resistivity of the high resistivity region r20' may be equal to or greater than about $10^7$ Ω·cm. For example, the resistivity of the high resistivity region r20' may be from about $10^7$ Ω·cm to about $10^{13}$ Ω·cm. A region of the channel layer 120a' below the high resistivity region r20' into which the impurities are not ion-implanted may be referred to as an effective channel region r10'. The thickness of the effective channel region r10' may be from about 50 nm to about 200 nm, for example. An ion-implanted buffer region r30' may be formed in the buffer layer 110a'. Then, the mask pattern 300 may be removed to obtain the structure shown in FIG. 7D.

The method described with reference to FIGS. 7A through 7D may be variously changed. For example, the mask pattern 300 may be formed on the channel layer 120 after removing the buffer layer 110 in FIG. 7A, and then a following process, e.g., impurity ion-implantation, may be performed. Alternatively, the impurities may be ion-implanted with the buffer layer 110 not removed, and then the buffer layer 110a' may be removed in FIG. 7D. Other modifications are also possible.

Since the high resistivity region r20' is formed by an ion-implantation process, the size, location, depth, etc. of the high resistivity region r20' may be easily controlled, and thus, characteristics of the HEMT may be easily controlled.

Figure 8:
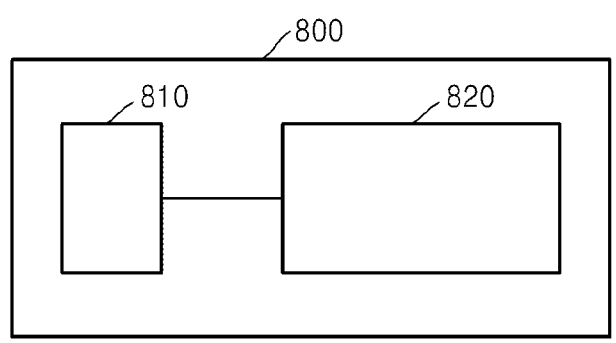
FIG. 8 is a plan view of an integrated circuit (IC) module according to example embodiments.

FIG. 8 is a plan view of an integrated circuit (IC) module 800 according to example embodiments. Referring to FIG. 8, the IC module 800 may include a HEMT 810 and a circuit 820 for controlling operation of the HEMT 810. The power electronic device 810 may include the HEMT 810 illustrated in FIGS. 1 to 4 and 9A to 9C.

Figure 9A:
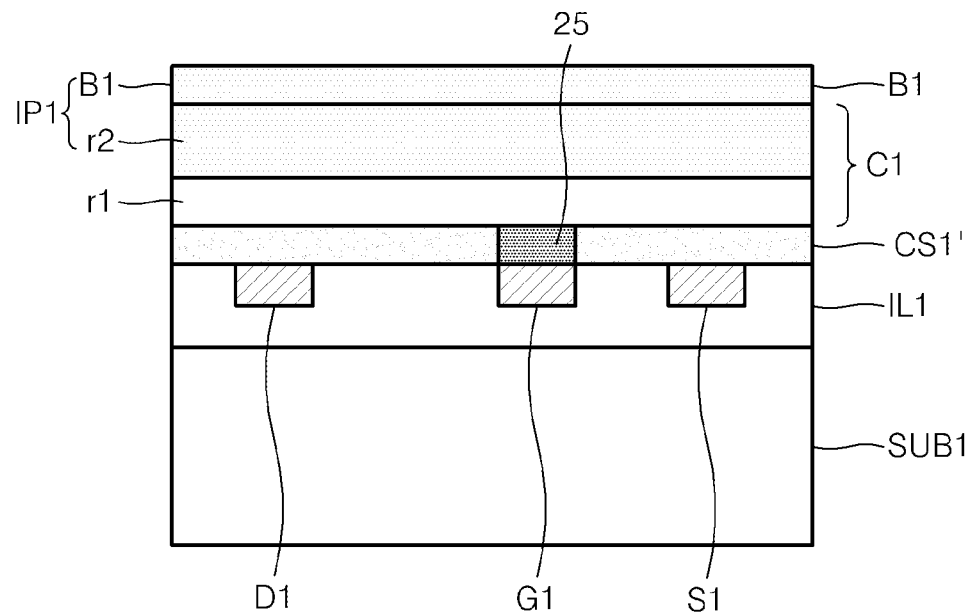
FIGS. 9A to 9C are cross-sectional views of HEMTs according to example embodiments.
Figure 9B:
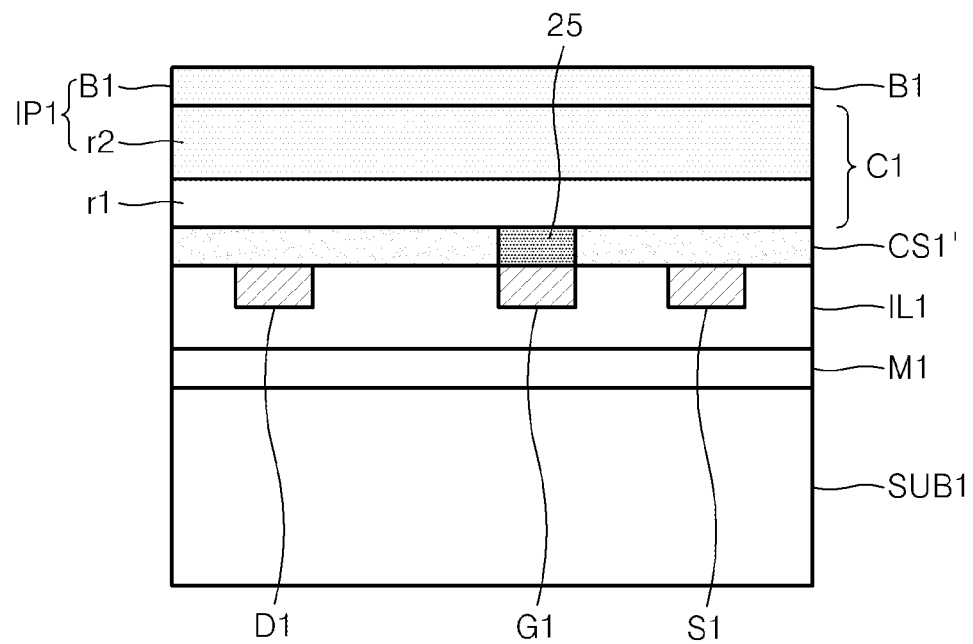
Figure 9C:
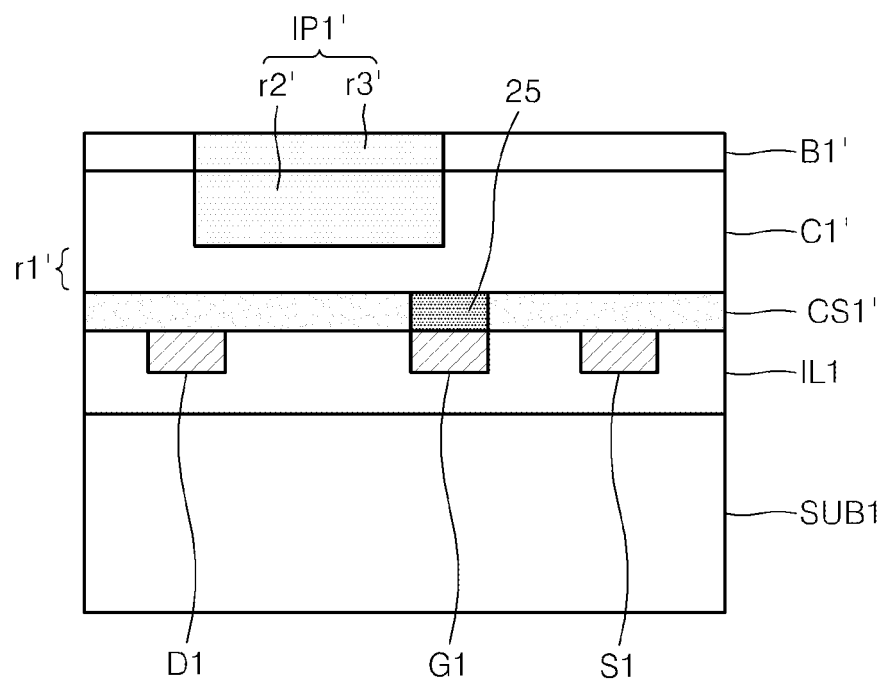

FIGS. 9A to 9C are cross-section views of HEMTs according to example embodiments. Only the differences between the HEMTs illustrated in FIGS. 1 to 3 and the FIGS. 9A to 9C are discussed below.

Referring to FIG. 9A, a HEMT according to example embodiments may be the same as the HEMT illustrated in FIG. 1, except the channel supply layer CS1' includes an impurity region 25 between the gate electrode G1 and the channel C1.

The impurity region 25 may contain one or more impurities, such as argon (Ar) gas, indium (In), phosphorous (P), arsenic (As) and/or a transition metal element that are implanted into the channel supply layer CS1'. Due to the one or more impurities in the impurity region 25, the lattice constant difference between the impurity region 25 and the effective channel region r1 may be reduced. As a result the density of the 2DEG formed in the effective channel region r1 at an interface between the effective channel region r1 and the impurity region 25 may be minimized and/or reduced.

Referring to FIG. 9B, a HEMT according to example embodiments may be the same as the HEMT illustrated in FIG. 9A, a metal bonding layer M1 may be disposed between the substrate SUB1 and the insulation layer IL1.

Referring to FIG. 9C, a HEMT according to example embodiments may be the same as the HEMT illustrated in FIG. 3, except the channel supply layer CS1' includes an impurity region 25 between the gate electrode G1 and the channel C1.

The impurity region 25 may contain one or more impurities, such as argon (Ar) gas, indium (In), phosphorous (P), arsenic (As) and/or a transition metal element that are implanted into the channel supply layer CS1'. Due to the one or more impurities in the impurity region 25, the lattice constant difference between the impurity region 25 and the effective channel region r1 may be reduced. As a result the density of the 2DEG formed in the effective channel region r1 at an interface between the effective channel region r1 and the impurity region 25 may be minimized and/or reduced.

Figure 10A:
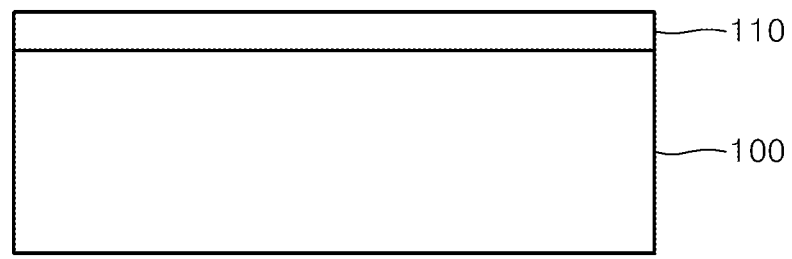
FIGS. 10A to 10C are cross-sectional views for describing a method of manufacturing a HEMT according to example embodiments.
Figure 10B:
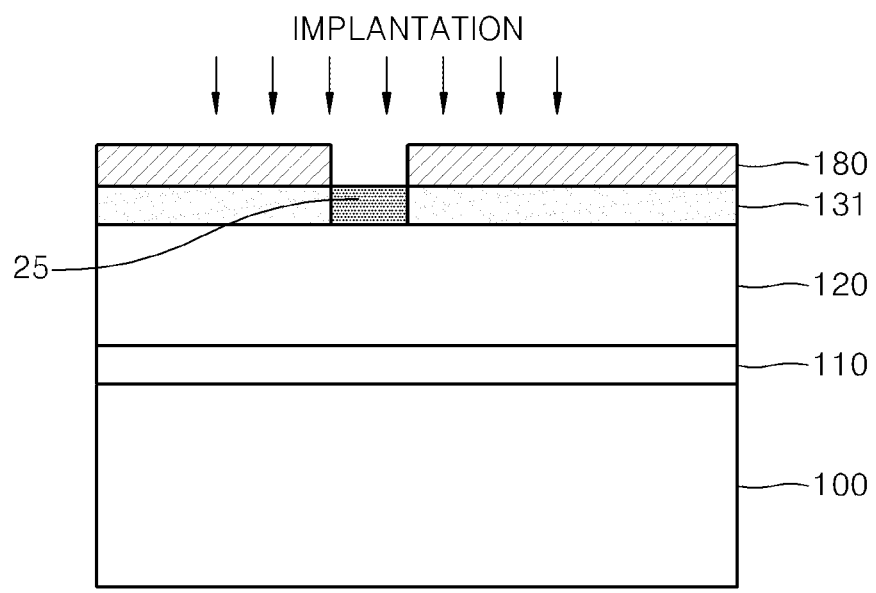
Figure 10C:
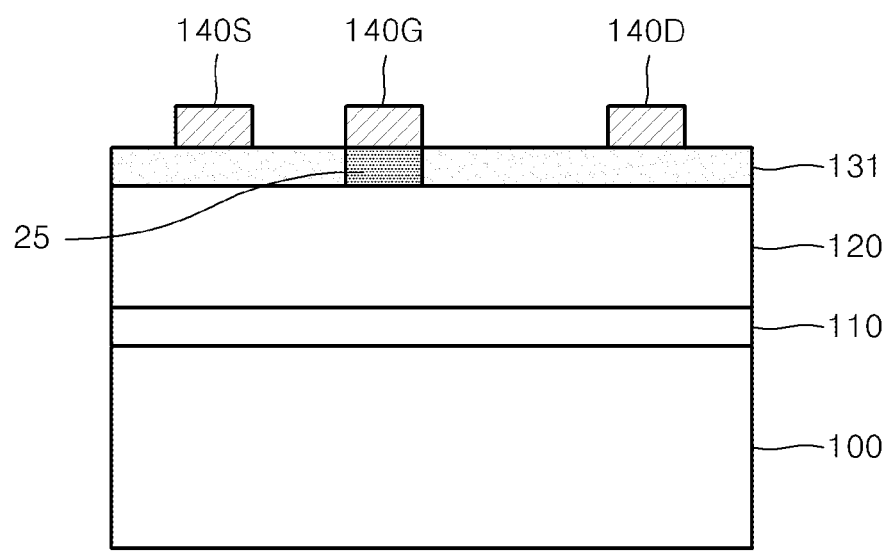

FIGS. 10A to 10C are cross-sectional vies for describing a method of manufacturing a HEMT according to example embodiments. Only the differences between FIGS. 6A to 6B and FIGS. 10A to 10C are discussed.

Referring to FIG. 10A, a buffer layer 110 may be formed on a first substrate 100.

Referring to FIG. 10B, the channel layer 120 may be formed on the buffer layer 110, and a channel supply layer 131 may be formed on the channel layer 120. The channel supply layer 131 may be the same as the channel supply layer 130 shown in FIG. 6B, except an impurity region 25 is formed in the channel supply layer 131. The impurity region 25 may be forming a resist pattern 180 over the channel supply layer 131 and implanting one or more impurities into a portion of the channel supply layer 131 exposed by the resist pattern 180. The impurities implanted into the region 25 may include at least one of argon (Ar) gas, indium (In), phosphorous (P), arsenic (As) and a transition metal element.

Referring to FIG. 10C, the resist pattern 180 is removed after forming the impurity region 25. Next, a source electrode 140S, gate electrode 140G, and drain electrode 140D are formed over the channel supply layer 131.

Next, after completing the steps shown in FIG. 10C, a method according to example embodiments may include steps similar to those illustrated in FIGS. 6C to 6H in order to form the HEMT illustrated in FIG. 9B, except including the channel supply layer 131 instead of the channel supply layer 130. Alternatively, after completing the steps shown in 10C, a method of according to example embodiments may include steps similar to those illustrated in FIGS. 6C to 6F and FIGS. 7A to 7D to form the HEMT illustrated in FIG. 9C, except including the channel supply layer 131 instead of channel supply layer 130.

It should be understood that example embodiments described herein should be considered in a descriptive sense only and not for purposes of limitation. For example, another material than the GaN-based material may be used for the channel layer and the channel supply layer. Also, methods according to example embodiments may be applied to a semiconductor device other than a HEMT. While some example embodiments have been particularly shown and described it will be understood by those of ordinary skill in the art that various changes in form and details may be made therein without departing from the spirit and scope of the claims.

What is claimed is:

1. A high electron mobility transistor (HEMT) comprising:
an insulation layer on a substrate;
a gate electrode, a source electrode, and a drain electrode, on the insulation layer;
a channel supply layer on the insulation layer, the channel supply layer contacting the gate electrode, the source electrode, and the drain electrode; and
a channel layer on the channel supply layer, the channel layer including a two-dimensional electron gas (2DEG) induced by the channel supply layer, an effective channel region contacting the channel supply layer, and a high resistivity region on the effective channel region, the high resistivity region being a region in which impurities are ion-implanted,
wherein the high resistivity region extends through a part of a top portion of the channel layer, and the part of the top portion of the channel layer including the high resistivity region corresponds to a region between the gate electrode and the drain electrode and does not correspond to a region between the gate electrode and the source electrode.

2. The HEMT of claim 1, wherein the impurities include at least one of neon (Ne), argon (Ar), carbon (C), iron (Fe), and vanadium (V).

3. The HEMT of claim 1, wherein the impurities are ion-implanted at a concentration of about $10^{15}/cm^3$ to about $10^{21}/cm^3$ in the high resistivity region.

4. The HEMT of claim 1, wherein a resistivity of the high resistivity region is equal to or greater than about $10^7$ Ω·cm.

5. The HEMT of claim 1, wherein a thickness of the effective channel region is about 50 nm to about 200 nm.

6. The HEMT of claim 1, wherein the channel layer includes a gallium nitride (GaN)-based material.

7. The HEMT of claim 1, wherein
the channel supply layer is one of a single and a multi-layer structure, and
the channel supply layer includes a nitride that contains at least one of aluminum (Al), gallium (Ga), indium (In), and boron (B).

8. The HEMT of claim 1, further comprising:
a metal layer between the substrate and the insulation layer.

9. The HEMT of claim 1, wherein the substrate includes one of a silicon (Si) substrate, a silicon carbide (SiC) substrate, an aluminum nitride (AlN) substrate, a direct bonded copper (DBC) substrate, and a metal substrate.

10. A power device comprising:
the HEMT of claim 1.

* * * * *